(12) United States Patent
Rao et al.

(10) Patent No.: US 7,499,368 B2
(45) Date of Patent: Mar. 3, 2009

(54) VARIABLE CLOCKING READ CAPTURE FOR DOUBLE DATA RATE MEMORY DEVICES

(75) Inventors: Ashwin K. Rao, Allen, TX (US); Sang-Won Song, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 713 days.

(21) Appl. No.: 11/052,371

(22) Filed: Feb. 7, 2005

(65) Prior Publication Data

US 2006/0176759 A1 Aug. 10, 2006

(51) Int. Cl.
G11C 8/00 (2006.01)
(52) U.S. Cl. .............................. 365/233.1; 365/189.05; 365/233.13
(58) Field of Classification Search ................. 365/233, 365/194, 189.05, 233.1, 233.13
See application file for complete search history.

(56) References Cited

U.S. PATENT DOCUMENTS

| | | | | |
|---|---|---|---|---|
| 6,477,110 B2 * | 11/2002 | Yoo et al. | .............. | 365/233.13 |
| 6,621,496 B1 * | 9/2003 | Ryan | .......................... | 345/533 |
| 6,850,444 B2 * | 2/2005 | Cho | ...................... | 365/189.05 |
| 7,038,972 B2 * | 5/2006 | Seo et al. | ............... | 365/189.15 |

* cited by examiner

*Primary Examiner*—Richard Elms
*Assistant Examiner*—Hien N Nguyen
(74) *Attorney, Agent, or Firm*—Frederick J. Telecky, Jr.; Wade J. Brady, III

(57) ABSTRACT

A system comprising a first double data rate (DDR) memory device, a second DDR memory device coupled to the first DDR memory device, the second DDR memory device not using a delay locked loop (DLL) device to synchronize clock signals. The system further comprises a logic coupled to the first and second DDR memory devices. The logic is adapted to receive data from the first and second DDR memory devices by way of a single conductive pathway.

21 Claims, 5 Drawing Sheets

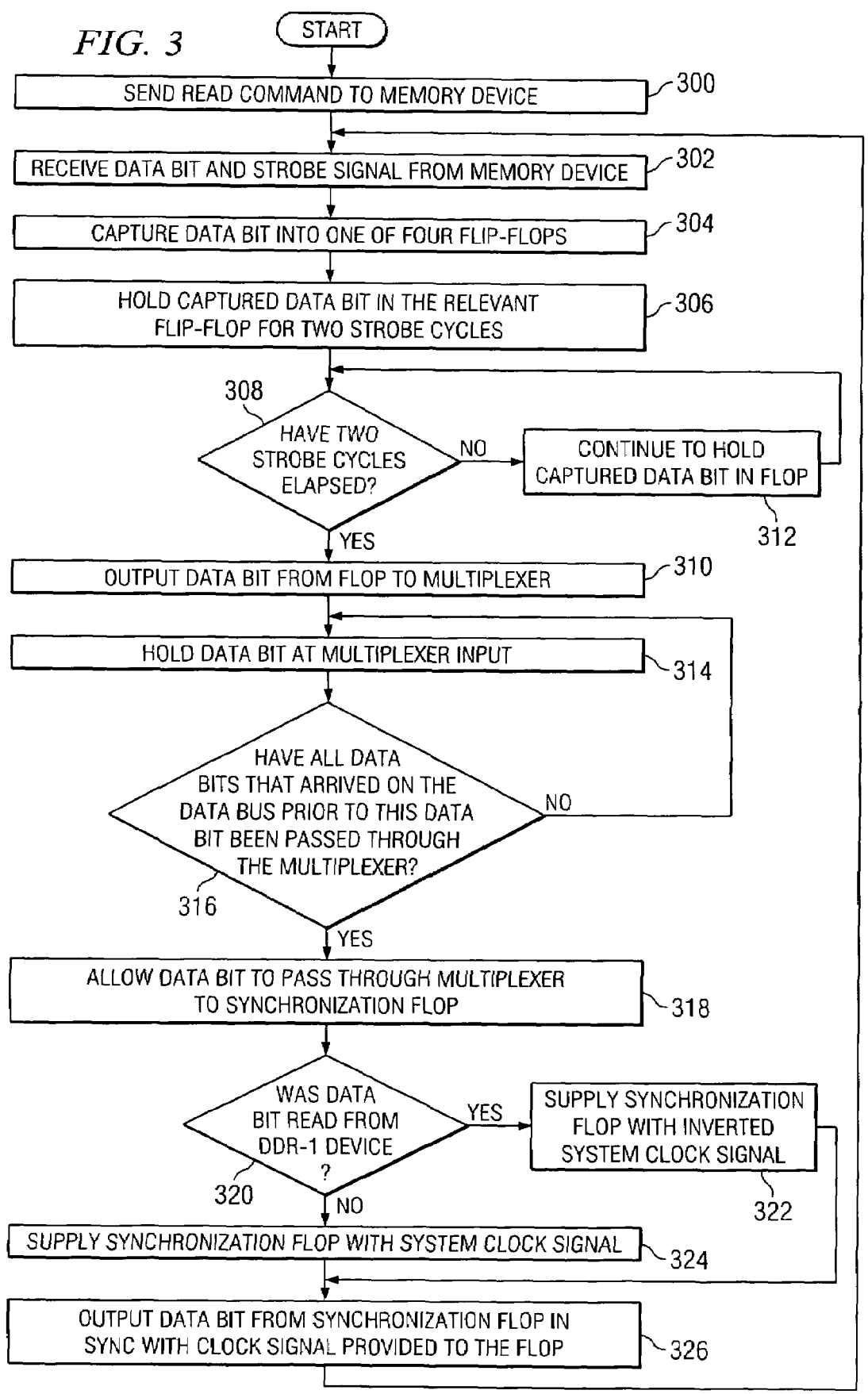

VARIABLE CLOCKING READ CAPTURE FOR DOUBLE DATA RATE MEMORY DEVICES

BACKGROUND

A synchronous dynamic random access memory (SDRAM) device performs at higher clock speeds than other types of memory devices by generating data which is synchronous with the clock of a central processing unit (CPU) communicating with the SDRAM. One type of SDRAM device is the Double Data Rate SDRAM (DDR-1), which, because it is able to read and/or write data on both the rising and falling edges of a clock signal supplied to the DDR-1, supports higher bandwidths than other types of memory devices.

In systems comprising a DDR-1 memory device, data is typically transferred between an application-specific integrated circuit (ASIC) and the DDR-1 via a multiple-bit data bus. Read/write operations from and to the DDR-1 are controlled using a system clock (CLK). However, variations in process, voltage and temperature (commonly known as PVT) may cause the CLK to become poorly synchronized with the data valid windows (i.e., time periods where all bits on the multiple-bit data bus have stabilized). This poor synchronization results in data that is improperly read from or written to the DDR-1.

Such poor synchronization is often corrected by substituting a strobe signal in place of the CLK when reading or writing data. As known to those of ordinary skill in the art, strobe signals flow in the same direction as the data, thus subjecting the strobe signals to the same PVT variations as the data bits. In the case of a read operation, for example, the strobe signal is generated by the DDR-1 and the data is pulled from the DDR-1, as well. In this case, both the data and the strobe signal flow from the DDR-1 to the ASIC. Thus, any PVT effects encountered by the data bits (e.g., length of metal traces from the DDR-1 to the ASIC reading the data) also are encountered by the strobe signal. For this reason, the data valid windows stay well-synchronized with the strobe signal. In turn, a delay locked loop (DLL) on the DDR-1 is used to keep the strobe signals well-synchronized with the system CLK, so that when the data bits finally reach the ASIC, the data bits may be synchronized to the system CLK so that the ASIC may use the data bits as necessary. Because these timing parameters are kept well-synchronized with each other (i.e., the data bits, the strobe signals and the system CLK), the system clock cycles at which the data bits may be synchronized to the system clock are predictable.

Because power efficiency is a substantial concern in wireless/mobile applications (e.g., mobile phones), DLLs are often omitted in DDR devices used in mobile applications (M-DDR). Although the omission of DLLs results in considerable power savings, the aforementioned strobe signals are no longer kept well-synchronized with the system CLK. Thus, once data bits arrive at the ASIC, it is difficult to synchronize them to the system CLK. If the bits cannot be synchronized to the system CLK, they cannot be used by the ASIC and are virtually useless. Furthermore, because variations in PVT may cause the synchronization between strobe signals and the system CLK to be offset by anywhere between +2 ns and +7 ns or more, the timing parameters (i.e., the relationship between data bits, strobe signals and system CLK) are considered to be unacceptably unpredictable. For this reason, M-DDR devices and DDR-1 devices on the same system cannot successfully share a single data path and instead use multiple data paths, thereby increasing manufacturing costs.

SUMMARY

The problems noted above are solved in large part by a system comprising a first double data rate (DDR) memory device, a second DDR memory device coupled to the first DDR memory device, the second DDR memory device not using a delay locked loop (DLL) device to synchronize clock signals. The system further comprises a logic coupled to the first and second DDR memory devices. The logic is adapted to receive data from the first and second DDR memory devices by way of a single conductive pathway.

Another embodiment is an apparatus comprising a plurality of flip-flops capable of substantially alternately storing data received from multiple double data rate (DDR) memory devices, at least one of the DDR memory devices not using a delay locked loop (DLL) device to synchronize clock signals. The apparatus receives data from the DDR memory devices via a single conductive pathway.

Yet another embodiment is a method comprising, via a single conductive pathway, receiving data and a strobe signal from multiple double data rate (DDR) memory devices, at least one of the devices not using a delay locked loop (DLL) device. The method also comprises storing the data in a logic for multiple strobe cycles.

BRIEF DESCRIPTION OF THE DRAWINGS

For a detailed description of exemplary embodiments of the invention, reference will now be made to the accompanying drawings in which:

FIG. 3 shows a flow diagram of a method that may be used by the system of FIG. 1a, in accordance with a preferred embodiment of the invention.

NOTATION AND NOMENCLATURE

Figure 1A:
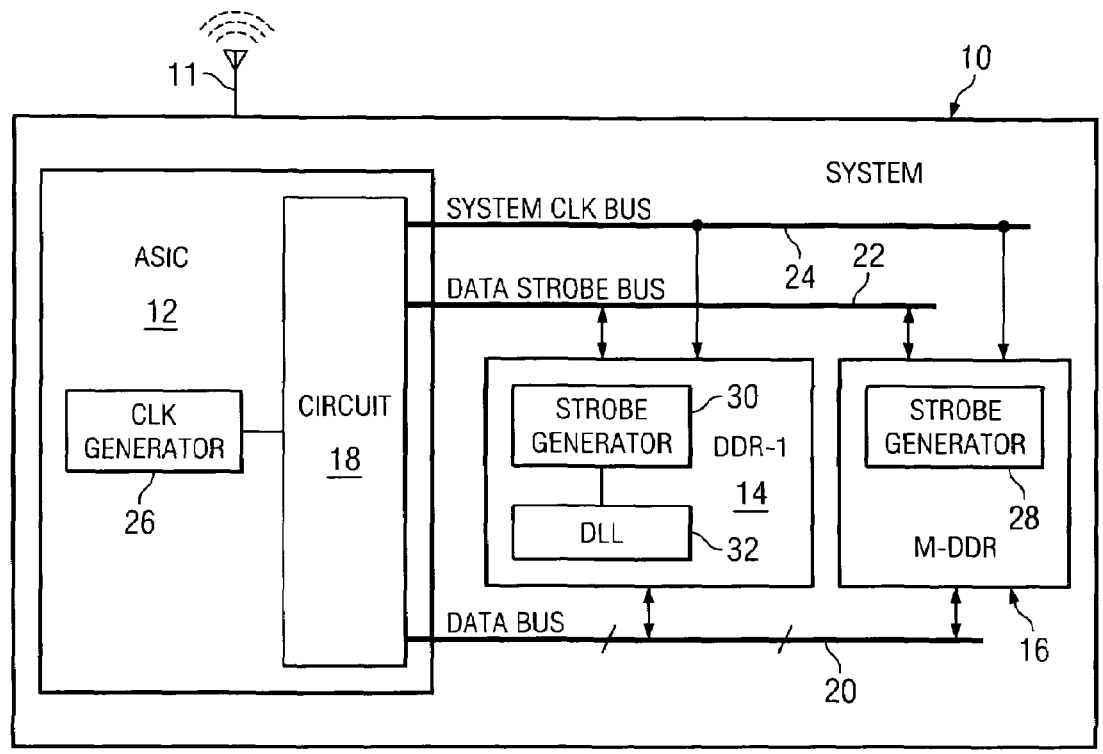
FIG. 1a shows a block diagram of a system comprising an application specific integrated circuit (ASIC) in communications with a dual data rate memory (DDR-1) and a mobile-dual data rate memory (M-DDR), in accordance with a preferred embodiment of the invention.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a circuit that enables the successful synchronization of data bits read from dual data rate (DDR-1) devices and mobile-DDR (M-DDR) devices to the CLK domain. In particular, the circuit comprises multiple flip-flops that are arranged such that each flip-flop captures and holds a received data bit for approximately two clock cycles before releasing the data bit. By holding each received data bit for two clock cycles, the flip-flop ensures that the data bit is not overwritten by a next data bit and also ensures that the captured data bit is successfully synchronized to the system CLK domain. Furthermore, because the circuit successfully synchronizes the data bits to the system CLK domain, the timing relationships between the system CLK, the strobe signal and the data are predictable. By making these timing relationships predictable, the circuit enables a DDR-1 device and an M-DDR device to successfully share a single data bus to the circuit, thereby preventing the need for expensive, additional silicon components in systems containing both DDR-1 and M-DDR devices. FIG. 1 shows an exemplary embodiment of a system comprising such a circuit.

Referring to FIG. 1, a preferred embodiment of a system 10 comprises an application-specific integrated circuit (ASIC) 12 that receives data from a double data rate SDRAM (DDR-1) 14 and a mobile-DDR (M-DDR) 16 by way of a data bus 20. The system 10 preferably is a wireless (e.g., battery-operated) communication system that wirelessly transmits and receives data by way of antenna 11, although the scope of disclosure is not limited to wireless systems. The ASIC 12 comprises a circuit 18 that receives and processes data from the data bus 20 before releasing the data to the remainder of the ASIC 12. The ASIC 12 also comprises a system CLK generator 26, which generates and sends a system CLK signal 24 to the DDR-1 14 and the M-DDR 16. The DDR-1 14 and the M-DDR 16 each may comprise a strobe signal generator 30, 28, respectively. The strobe signal generators 30, 28 generate strobe signals that may be carried to the ASIC 12 by way of the data strobe bus 22. The strobe generator 30 of the DDR-1 14 also may be coupled to a delay locked loop (DLL) 32, which in turn is coupled to the system CLK signal 24. The ASIC 12 may be any suitable circuit logic, such as a processor, a memory controller, etc.

During an illustrative read operation from the DDR-1 14, a strobe signal is emitted by the strobe generator 30 in response to a "read" command received from the ASIC 12, thus causing the DDR-1 14 to output data onto the data bus 20. The data bus 20 may carry any suitable number of bits. For example, the data bus 20 may be an 8-bit bus, a 16-bit bus or any other type of bus, and the DDR-1 14 may output a number of data bits onto the data bus 20 accordingly. In the system 10, the data bus 20 is an 8-bit (i.e., 1-byte) bus, so the DDR-1 14 releases 1 byte onto the data bus 20 at a time.

In the system 10, the strobe generator 30 generates a strobe signal that is carried along the data strobe bus 22 to the ASIC 12, while the DDR-1 14 outputs a byte of data onto the data bus 20. As previously described, during read/write operations, a strobe signal is used in place of the system CLK signal 24, since the strobe signal and the data travel in the same direction and from a common starting point, thus preventing problems in phase relationships that would arise if the data were instead associated with the system CLK signal 24. For this reason, the strobe signal and the data on the data bus 20 are edge-aligned, essentially meaning that the data valid windows of the data are aligned time-wise with pulses on the strobe signal. The edge-alignment of the data and the strobe signal is illustrated in FIG. 1b. Referring to FIG. 1b, a strobe signal 50 is shown having multiple pulses 52. Each pulse 52 has a rising edge 54 and a falling edge 56. FIG. 1b also shows a data signal 60 comprising data valid windows 62, which are points where all data bits on the data bus 20 (i.e., in this illustrative embodiment, 8 bits) are valid. The signals 50, 60 are considered to be edge-aligned because the rising and falling edges 54, 56 are aligned with points on the data signal 60 where the data is changing value (i.e., points on the data signal 60 that do not fall into any of the data valid windows 62). Because the strobe signal 50 and the data signal 60 are output by the DDR-1 14 at substantially the same time, and because both the signals 50, 60 experience similar operational conditions (e.g., ambient temperature, length of metal traces from the DDR-1 14 to the ASIC 12), the signals 50, 60 are likely to remain synchronous with each other. Because the strobe signal 50 serves as a temporary "clock" for the data signal 60, the data signal 60 is considered to be a slave to the strobe signal 50.

Although the data signal 60 uses the strobe signal 50 as a reference clock while the data travels along the data bus 20 to the ASIC 12, when the ASIC 12 receives the data, the ASIC 12 cannot use the data without first synchronizing the data to the system CLK domain. More specifically, some or all of the ASIC 12 operates using the system CLK that is generated by the CLK generator 26. Thus, the ASIC 12 cannot use the received data if the data is not synchronized with the system CLK domain. Accordingly, the ASIC 12 conforms the received data to the system CLK domain so that the ASIC 12 may use the data as needed. However, while the data signal 60 may be closely synchronized with the strobe signal 50, if the strobe signal 50 is not closely synchronized with the system CLK domain, then it is difficult to synchronize the data signal 60 to the system CLK domain. Thus, the DDR-1 14 uses the DLL 32 to ensure that the strobe signal 50 remains at least somewhat synchronized (i.e., to a reasonable degree) with the system CLK domain. The DLL 32 accomplishes this synchronization between the strobe signal 50 and the system CLK domain by monitoring the phase relationship between the signals (the DLL 32 is provided with the system CLK signal 24 from the system CLK generator 26. If the DLL 32 detects an unacceptable difference in phase between the two signals, then the DLL 32 negates the difference in phase by adjusting the phase of one or both of the signals until the phase relationship of the signals is again at an acceptable level (i.e., generally within ±0.5 ns).

While DLL-containing devices (e.g., DDR-1 devices) generally are able to maintain synchronization between the strobe signal and the system CLK domain, as previously mentioned, DLLs generally are omitted in M-DDRs. In some embodiments, for example, the M-DDR 16 may not comprise a DLL, although M-DDRs in other embodiments may comprise DLLs. Accordingly, because the M-DDR 16 of FIG. 1 lacks a DLL, strobe signals generated by the strobe generator 28 may be closely synchronized with data output by the M-DDR 16, but the strobe signals typically may vary from the system CLK domain by anywhere between +2 ns and +7 ns. Such poor synchronization between the strobe signal and the system CLK domain make it difficult to synchronize the data to the system CLK domain. The circuit 18 of the ASIC 12 addresses this problem as described below.

Referring again to FIGS. 1a and 1b, the ASIC 12 receives the data on the data bus 20 and the strobe signal on the strobe bus 22 by way of the circuit 18. The circuit 18 processes most, if not all, strobe signals and data substantially similarly, regardless of whether the strobe signals and data are read from a DDR-1 device or an M-DDR device. The circuit 18 comprises, among other things, a plurality of flip-flops (shown in FIG. 2a). In a preferred embodiment, the circuit 18 may comprise four flip-flops. As previously mentioned, DDR devices are different from traditional memory devices in that DDR devices may read and/or write data on not just one clock edge, but both the rising and the falling clock edge. In this embodiment, data is read on both rising edges and falling edges. Thus, two of the four flip-flops (hereinafter referred to as Pair A) are used to capture data that arrives on a rising edge of the strobe signal 50, and the other two of the four flip-flops (hereinafter referred to as Pair B) are used to capture data that arrives on a falling edge of the strobe signal 50.

Referring to Pair A, each of the two flops holds one bit of data at a time. Furthermore, each flop preferably holds a bit for two clock (i.e., strobe) cycles, although in some embodiments, the flop may hold the bit for more or less than two clock cycles. Although DDR devices read and output data bits on rising and falling edges of the strobe signal, because the Pair A processes only bits that are read on the rising edges, there is a period of one clock cycle in between each bit that is transferred to Pair A. Thus, in order for a flop in Pair A to hold a bit for two clock cycles, the other flop stores the data bit that arrives before the two clock cycles has expired. As explained in further detail below, by holding a bit for two clock cycles, a flop ensures that the bit will be captured successfully, will not be overwritten by a following bit, and will provide enough of a time window to successfully be synchronized with the system CLK domain, thereby allowing the ASIC 12 to use the data bit as necessary. The flops in Pair B process data bits similarly to the flops of Pair A. The precise operation of circuit 18 is described in context of FIG. 2a.

Figure 2A:
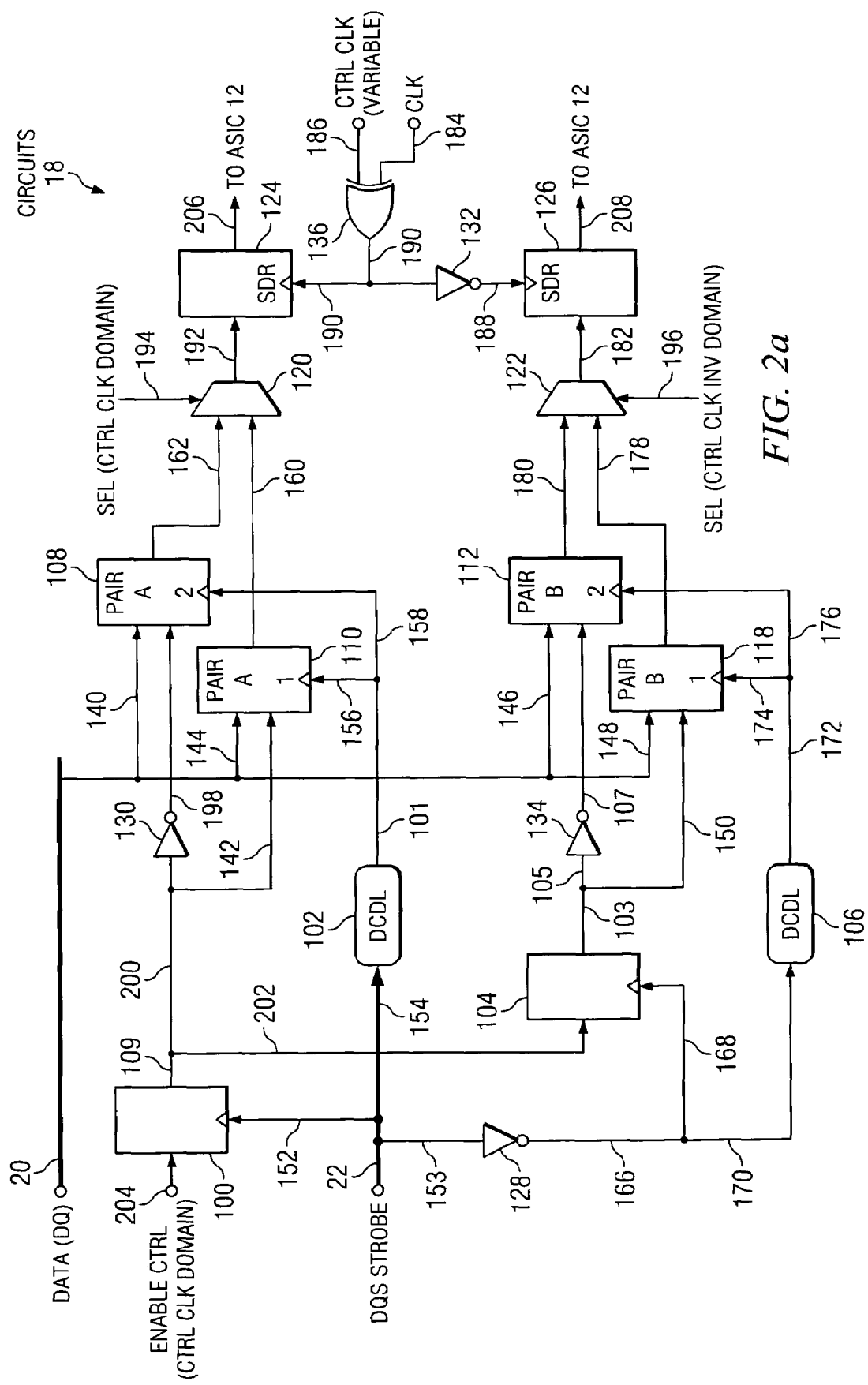
FIG. 2a shows a circuit schematic of a plurality of flip-flops, multiplexers and other circuit logic within the ASIC of FIG. 1a, in accordance with a preferred embodiment of the invention.

FIG. 2a shows the circuit 18 in greater detail. Circuit 18 comprises, among other things, edge-triggered flip-flops 100, 104, 108, 110, 112, 118, 124 and 126, although other types of flops also may be used. The data inputs of flops 100, 104 are coupled to an enable signal 204, which may be provided by the ASIC 12. The flops 100, 104 are used to synchronize the enable signal 204, described below, to rising strobe clock edges for the flops in Pair A and to falling strobe clock edges for the flops in Pair B (i.e., because the flop 104 is provided with a strobe signal 168 that has been inverted from its original polarity by inverter 128). The data outputs 109, 103 of the flops 100, 104 are supplied to the enable inputs of the flops 110, 118 via lines 142, 150, respectively. The enable signal 204 also is supplied to inverters 130, 134, whose outputs are supplied to the enable inputs of the flops 108, 112 via lines 198, 107, respectively.

The data inputs for flops 108, 110, 112 and 118 are coupled to the data bus 20 via lines 140, 144, 146, and 148, respectively. The flop 100, the digitally controlled delay line (DCDL) 102 and the inverter 128 are provided with the strobe signal of strobe signal bus 22 via lines 152, 154 and 153, respectively. The DCDL 102 shifts the phase of the strobe signal 22 by 90 degrees, resulting in an output signal 101 that is supplied to the clock inputs of the flops 108, 110 via lines 158, 156, respectively. Similarly, the DQS signal 164 is inverted by the inverter 128, resulting in a signal 166 that is supplied to the clock input of the flop 104 and the DCDL 106 via lines 168, 170, respectively. The DCDL 106 shifts the phase of the inverted DQS signal by 90 degrees, resulting in a signal 172 that is supplied to the clock inputs of the flops 112, 118 via lines 176, 174, respectively. In other embodiments, the 90 degree phase shift may be achieved by using other suitable circuitry. Furthermore, the phase shift delay introduced in the strobe signal 22 may be a value other than 90 degrees.

The data outputs of the flops 108, 110 are supplied to a multiplexer 120 via lines 162, 160, respectively. Similarly, the data outputs of the flops 112, 118 are supplied to a multiplexer 122 via lines 180, 178, respectively. The outputs 192, 182 of the multiplexers 120, 122 are determined by the select signals 194, 196, respectively, which may be provided by the ASIC 12. The outputs 192, 182 of the multiplexers 120, 122 are supplied to the data inputs of synchronization flops 124, 126, respectively. The CLK generator 26 supplies a system CLK signal 184 to an XOR gate 136 along with a control signal 186, whose value is dictated by the ASIC 12 as described below. In other embodiments, the XOR gate 136 may be substituted with any suitable circuit logic. The output 111 of the XOR gate 136 is supplied to the clock input of the synchronization flop 124 as-is via line 190, and is supplied to the clock input of the synchronization flop 126 via line 188 and inverter 132. The outputs 206, 208 of the synchronization flops 124, 126 may be supplied to the ASIC 12, respectively.

Figure 2B:
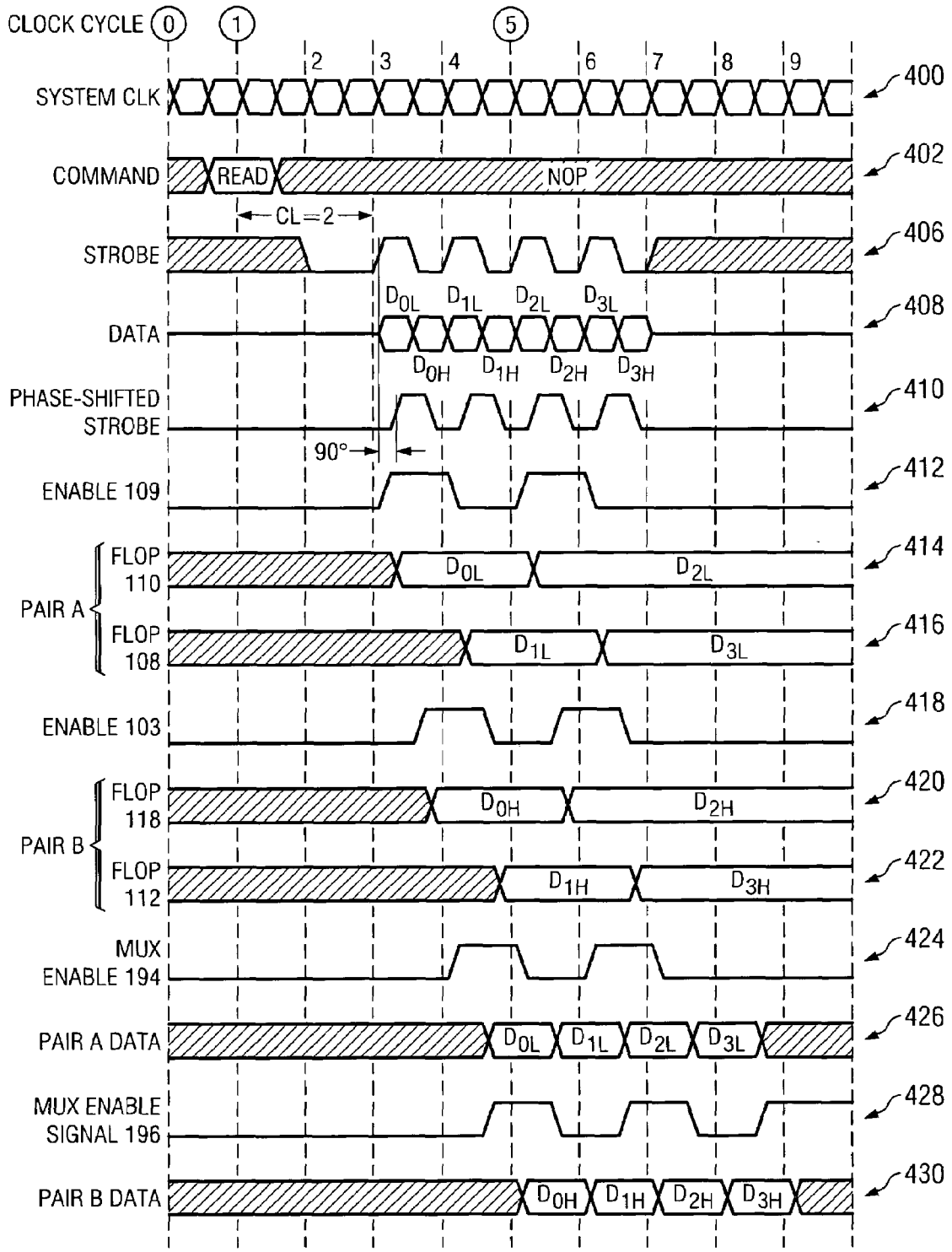
FIG. 2b shows a timing diagram of a DDR-1, in accordance with embodiments of the invention.
Figure 2C:
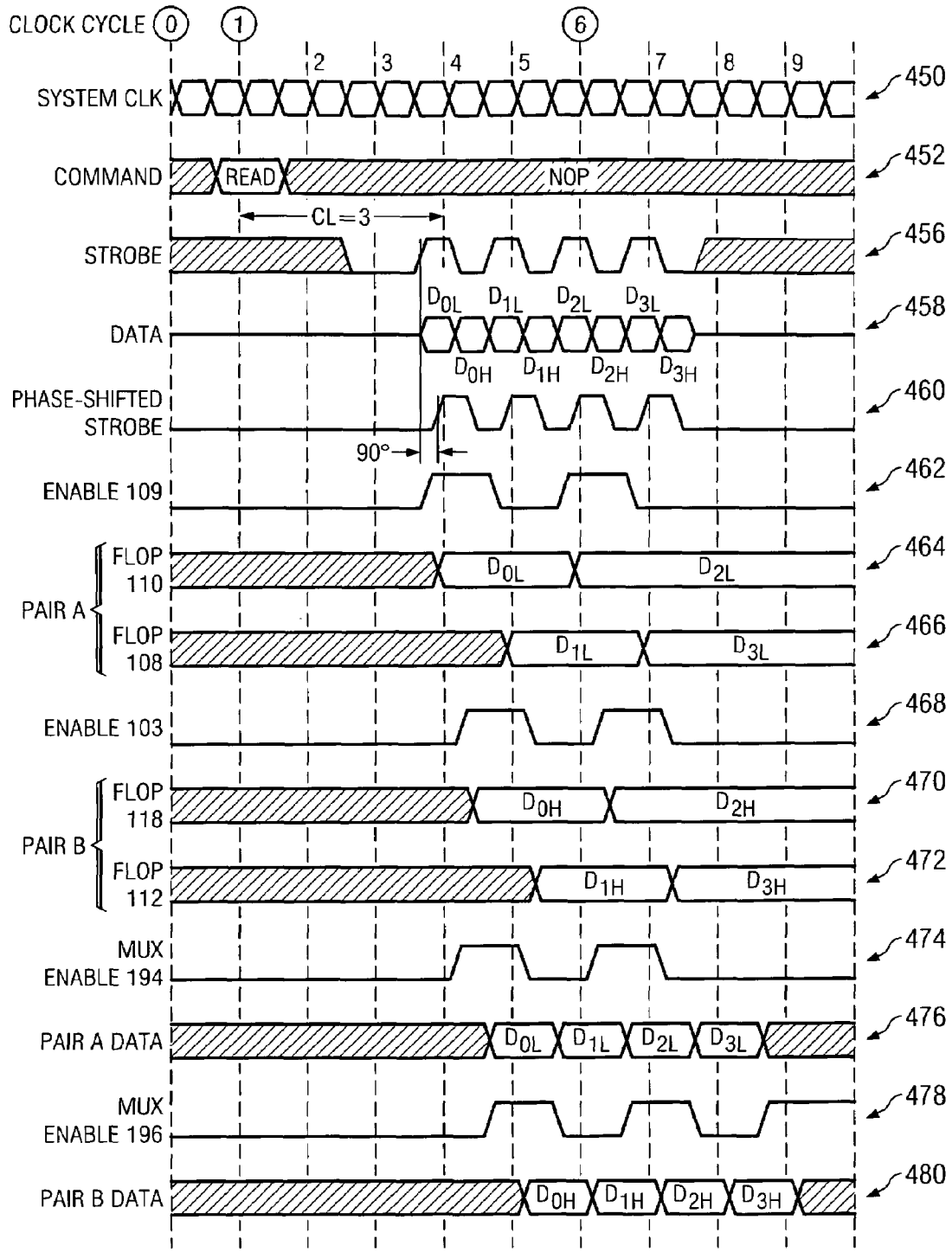
FIG. 2c shows a timing diagram of an M-DDR, in accordance with embodiments of the invention.

FIGS. 2b and 2c show timing diagrams for DDR-1 read accesses and M-DDR read accesses, respectively. Line 400 of FIG. 2b and line 450 of FIG. 2c show the system CLK signal 24. Lines 402 and 452 show a read command sent to the DDR memories DDR-1 14 and M-DDR 16, respectively. Lines 406 and 456 show strobe signals as generated by the strobe generators 30, 28, respectively. Lines 408 and 458 show the data valid windows on the data bus 20. Lines 410 and 460 show the strobe signal of lines 406 and 456 phase-shifted by 90 degrees, respectively, for reasons described further below. Lines 412 and 462 show the enable signal 109 that is output from the flop 100. Lines 414 and 464 show data being stored into flop 110. Lines 416 and 466 show data being stored into flop 108. Lines 418 and 468 show the enable signal 103 that is output from the flop 104. Lines 420 and 470 show data being stored into flop 118. Lines 422 and 472 show data being read into flop 112. Lines 424 and 474 show enable signal 196 being applied to the multiplexer 122. Finally, lines 426 and 476 show data being read from the circuit 18 into the rest of the ASIC 12. FIGS. 2b and 2c are now discussed in turn, each in context of the circuit 18 of FIG. 2a.

Referring to FIGS. 1a, 1b, 2a and 2b, line 402 shows a READ command that is sent to the DDR-1 14 by the ASIC 12. The READ command, among other things, instructs the DDR-1 14 how soon after the READ command is sent that the DDR-1 14 is to begin transferring data to the ASIC 12 via bus 20. In this embodiment, the DDR-1 14 is instructed to wait for 2 clock cycles (i.e., the column address strobe latency (CL) is 2, as marked on the figure) before transferring the strobe signal 50 and the data signal 60 by way of buses 22 and 20, respectively. As shown on line 402, the READ command occurs at clock cycle 1. Thus, two clock cycles later, the DDR-1 14 begins to transmit strobe signals 50 and data signals 60 to the ASIC 12, as seen in lines 406 and 408, respectively.

The strobe signals 50 begin traveling from the DDR-1 14 to the circuit 18 (i.e., the ASIC 12) via the strobe bus 22 starting at clock cycle 3. The data signals 60 also begin traveling from the DDR-1 14 to the circuit 18 via the bus 20 starting at clock cycle 3. As seen in line 408, because the DDR-1 14 is a DDR device, data is read on both the rising and falling edges of the strobe signal 50.

Referring in particular to FIG. 2a, the strobe signals 50 arrive at the circuit 18 via the strobe line 22. The data signals 60 arrive at the circuit 18 at the data bus 20. Each data bit is routed to each of the D-inputs of the flops 108, 110, 112 and 118 by way of lines 140, 144, 146 and 148, respectively. The flops 108, 110 are paired together (hereinafter referred to as Pair A) to process data bits arriving on rising clock edges of the strobe signal 50. The flops 112, 118 are paired together (hereinafter referred to as Pair B) to process data bits arriving on falling clock edges of the strobe signal 50. Each of the flops 108, 110, 112 and 118 is provided with a strobe signal 50.

Because Pair A processes data that arrive on the rising edges of strobe signal pulses, the strobe signal 50 is routed into the flops 108, 110 having the polarity with which it arrived. Conversely, because Pair B processes data that arrive on the falling edges of strobe signal pulses, the strobe signal 50 is inverted by an inverter 128, so that the polarity of the strobe signal 50 is reversed. Although the flops 112 and 118 may be rising edge triggered flops, in other embodiments, the flops 112 and 118 may be falling edge triggered flops and thus may not require the reversal of polarity for the strobe signal 50.

When the strobe signal 50 arrives at the circuit 18 on bus 22, the strobe signal 50 is edge-aligned with the data, as seen in lines 406 and 408. In order for the flops to properly capture the data bits, the data and the strobe signal are to be center-aligned. For this reason, the strobe signal 50 is routed through a DCDL 154 or 106 prior to use by any of the flops. The DCDLs 154, 106 shift the phase of the strobe signal 50 by approximately 90 degrees, so that the strobe signal 50 and the data signal 60 are center-aligned, as shown in lines 408, 410.

Each of the flops 108, 110, 112 and 118 also is provided with an enable signal that may activate or deactivate a flop. Line 412 shows the timing of the enable signal 109 and line 418 shows the timing of the enable signal 103, which is a half-cycle delayed form of signal 109. As mentioned above, Pair A processes data that is valid during rising-edges of the strobe signal, and Pair B processes data that is valid during falling-edges of the strobe signal. Accordingly, the enable signal 109, which feeds the flops in Pair A, becomes high during some of the rising edges of the strobe signal shown in line 410. Similarly, the enable signal 103, which feeds the flops in Pair B, becomes high during some of the falling edges of the strobe signal shown in line 406. The frequency of the enable signals 109, 103 is approximately half that of the strobe signal in line 406 because the flops in Pairs A and B preferably hold data bits for two clock cycles, for the reasons explained above.

Thus, the data bits $D_{0L}$, $D_{0H}$, $D_{1L}$, $D_{1H}$, $D_{2L}$, $D_{2H}$, $D_{3L}$, and $D_{3H}$ shown in line 408 and arriving on data bus 20 may be processed as follows. First, the $D_{0L}$ is routed to the D-input of each of the flops 108, 110, 112 and 118. Because $D_{0L}$ is valid during a rising strobe edge, as seen in lines 408, 410, it is processed by Pair A instead of Pair B. Specifically, within Pair A, $D_{0L}$ is captured by flop 110 instead of flop 108, since the enable signal 109 is high, thereby making flop 110 active and flop 108 inactive. $D_{0L}$ is captured into flop 110 at cycle 3, and because $D_{0L}$ preferably is held in flop 110 for two clock cycles, new data is not captured into flop 110 until cycle 5.

The next bit, $D_{0H}$, arrives at the D-inputs of each of the flops in Pairs A and B. Because $D_{0H}$ is valid during a falling strobe edge, as seen in lines 408, 410, it is processed by Pair B instead of Pair A. Specifically, within Pair B, $D_{0H}$ is captured by flop 118 instead of flop 112, since the enable signal 103 is high, thereby making flop 118 active and flop 112 inactive. $D_{0H}$ is captured by flop 118 at cycle 3, and because $D_{0H}$ preferably is held in flop 118 for two clock cycles, new data is not captured into flop 118 until cycle 5.

The next bit, $D_{1L}$, arrives at the D-inputs of each of the flops in Pairs A and B. Because $D_{1L}$ is valid during a rising strobe edge, as seen in lines 408, 410, it is processed by Pair A instead of Pair B. Specifically, within Pair A, $D_{1L}$ is captured by flop 108 instead of flop 110, since the enable signal 109 is low, thereby causing flop 108 to be activated and flop 110 to be deactivated. Because the data is captured into flop 108 instead of flop 110, the data in flop 110 (i.e., $D_{0L}$) is not overwritten. $D_{1L}$ is captured by flop 108 at cycle 4, and because $D_{1L}$ preferably is held in flop 108 for two clock cycles, new data is not captured into flop 108 until cycle 6.

The next bit, $D_{1H}$, arrives at the D-inputs of each of the flops in Pairs A and B. Because $D_{1H}$ is valid during a falling strobe edge, as seen in lines 408, 410, it is processed by Pair B instead of Pair A. Specifically, within Pair B, $D_{1H}$ is captured by flop 112 instead of flop 118, since the enable signal 103 is low, thereby causing flop 112 to be activated and flop 118 to be deactivated. Because the data is captured into flop 112 instead of flop 118, the data in flop 118 (i.e., $D_{0H}$) is not overwritten. $D_{1H}$ is captured by flop 112 at cycle 4, and because $D_{1H}$ preferably is held in flop 112 for two clock cycles, new data is not captured into flop 112 until cycle 6.

The next bit, $D_{2L}$, arrives at the D-inputs of each of the four flops in Pairs A and B. Because $D_{2L}$ is valid during a rising strobe edge, as seen in lines 408, 410, it is processed by Pair A instead of Pair B. Specifically, within Pair A, $D_{2L}$ is captured by flop 110 instead of flop 108, since the enable signal 109 is high, thereby causing flop 110 to be activated and flop 108 to be deactivated. At the time $D_{2L}$ is captured into flop 110, the previous data that has been stored in flop 110 (i.e., $D_{0L}$) for two clock cycles is output from the flop 110 to the multiplexer 120 via line 160. Because the data is captured into flop 110 instead of flop 108, the data in flop 108 (i.e., $D_{1L}$) is not overwritten. $D_{2L}$ is captured by flop 110 during cycle 5, and because $D_{2L}$ preferably is held in flop 110 for two clock cycles, new data is not captured into flop 110 at least until cycle 7.

The next bit, $D_{2H}$, arrives at the D-inputs of each of the flops in Pairs A and B. Because $D_{2H}$ is valid during a falling strobe edge, as seen in lines 408, 410, it is processed by Pair B instead of Pair A. Specifically, within Pair B, $D_{2H}$ is captured by flop 118 instead of flop 112, since the enable signal 103 is high, thereby causing flop 118 to be activated and flop 112 to be deactivated. At the time $D_{2H}$ is captured into flop 118, the previous data that has been stored in flop 118 (i.e., $D_{0H}$) for two clock cycles is output from the flop 118 to the multiplexer 122 via line 178. Because the data is captured into flop 118 instead of flop 112, the data in flop 112 (i.e., $D_{1H}$) is not overwritten. $D_{2H}$ is captured by flop 118 during cycle 5, and since $D_{2H}$ preferably is held in flop 118 for two clock cycles, new data is not captured into flop 118 at least until cycle 7.

The next bit, $D_{3L}$, arrives at the D-inputs of each of the flops in Pairs A and B. Because $D_{3L}$ is valid during a rising strobe edge, as seen in lines 408, 410, it is processed by Pair A instead of Pair B. Specifically, within Pair A, $D_{3L}$ is captured by flop 108 instead of flop 110, since the enable signal 109 is low, thereby causing flop 108 to be activated and flop 110 to be deactivated. At the time $D_{3L}$ is captured into flop 108, the previous data that has been stored in flop 108 (i.e., $D_{1L}$) for two clock cycles is output from the flop 108 to the multiplexer 120 via line 162. Because the data is captured into flop 108 instead of flop 110, the data in flop 110 (i.e., $D_{2L}$) is not overwritten. $D_{3L}$ is captured by flop 108 during cycle 6, and since $D_{3L}$ preferably is held in flop 108 for two clock cycles, new data is not captured into flop 108 at least until cycle 8.

The next bit, $D_{3H}$, arrives at the D-inputs of each of the flops in Pairs A and B. Because $D_{3H}$ is valid during a falling strobe edge, as seen in lines 408, 410, it is processed by Pair B instead of Pair A. Specifically, within Pair B, $D_{3H}$ is captured by flop 112 instead of flop 118, since the enable signal 103 is low, thereby causing flop 112 to be activated and flop 118 to be deactivated. At the time $D_{3H}$ is captured into flop 112, the previous data that has been stored in flop 112 (i.e., $D_{1H}$) for two clock cycles is output from the flop 112 to the multiplexer 122 via line 180. Because the data is captured into flop 112 instead of flop 118, the data in flop 118 (i.e., $D_{2H}$) is not overwritten. $D_{3H}$ is captured by flop 112 during cycle 6, and since $D_{3H}$ preferably is held in flop 112 for two clock cycles, new data is not captured into flop 112 at least until cycle 8.

Data bits that are output from each of the flops in Pairs A and B are input into the multiplexers 120, 122 via lines 162, 160, 180 and 178. Multiplexer 120 processes data bits that are valid on the rising edge of the strobe signal, since the flops of Pair A output data to the multiplexer 120. Multiplexer 122 processes data bits that are valid on the falling edge of the strobe signal, since the flops of Pair B output data to the multiplexer 122. The multiplexer control signals 194, 196 are controlled by the ASIC 12 and are shown in lines 424, 428, respectively. Because the multiplexer 120 handles data valid on strobe rising edges and the multiplexer 122 handles data valid on strobe falling edges, the control signal 196 may be delayed by half of one cycle in comparison to control signal 194.

Data bits are output from each of the multiplexers in an alternating fashion, such that the order in which the data bits were received on bus 20 is the same order in which they are output from the multiplexers 120, 122. For example, referring to lines 424 and 426, line 424 shows the control signal 194 alternating between logic levels high and low. On each edge of the signal 194, a data bit from Pair A is output by the multiplexer 120. As shown in line 426, $D_{0L}$ is output first, $D_{1L}$ is output second, $D_{2L}$ third, and $D_{3L}$ last. Similarly, referring to lines 428, 430, line 428 shows the control signal 196 alternating between logic levels high and low. On each edge of the signal 196, a data bit from Pair B is output by the multiplexer 122. As shown in line 430, $D_{0H}$ is output first, followed by $D_{1H}$ second, $D_{2H}$ third, and $D_{3H}$ last. Referring to lines 424 and 428, the control signal 196 in line 428 is delayed by one half clock cycle in comparison to the control signal 194 in line 424, as mentioned above. Examining lines 426, 430, the data bits are output from the multiplexers 120, 122 in the same overall order they were received from the data bus 20: $D_{0L}, D_{0H}, D_{1L}, D_{1H}, D_{2L}, D_{2H}, D_{3L}, D_{3H}$.

Figure 1B:
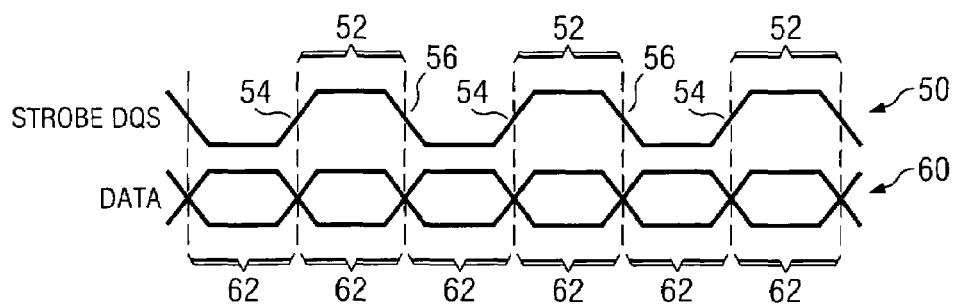
FIG. 1b shows a strobe waveform edge-aligned with a data waveform.

Referring to FIGS. 1a, 2a and 2c, FIG. 2c shows the timing diagram for a data read operation from the M-DDR 16 to the circuit 18. A data read operation from the M-DDR 16 may be substantially similar to the data read operation for the DDR-1 14 described immediately above. Thus, for brevity, the details of a data read operation for the M-DDR 16 are not reproduced below. However, one of the differences between data read operations for the M-DDR 16 and the DDR-1 14 may include different CL values as assigned by the ASIC 12, based on any of a variety of memory characteristics and operating conditions. These CL values dictate the number of clock cycles that are to elapse between the time a READ command has been sent, such as in line 402, and the time data is read from the DDR-1 14 or the M-DDR 16. The CL value in FIG. 2b is 2, as indicated between lines 404, 406. The CL value in FIG. 2c is 3, as indicated between lines 454, 456.

Another difference between the way the circuit 18 processes data read from the M-DDR 16 versus data read from the DDR-1 14 concerns the synchronization flops 124, 126. The synchronization flops 124, 126 receive data bits from the multiplexers 120, 122, respectively. The synchronization flops 124, 126 synchronize the received data bits to the system CLK domain by capturing a data bit and subsequently releasing the data bit in sync with the system CLK signal 24 generated by the CLK generator 26. The synchronization flops 124, 126 release the data bits in sync with the system CLK domain using clock signals 190, 188, respectively. Signal 188 is an inverted form of signal 190 (inverted by inverter 132). Signal 188 is inverted because it is used by the synchronization flop 126 to synchronize data bits from Pair B to the system CLK domain. As explained above, Pair B processes data that is valid on falling strobe edges. Thus, to properly synchronize such data to the system CLK domain, the synchronization flop 126 uses an inverted form of the signal 190 (i.e., signal 188).

The signal 190 is produced by the XOR gate 136 using two different input signals. Although an XOR gate 136 is shown in this embodiment, other embodiments may use different circuit logic and/or different input signals into the circuit logic.

In the embodiment of FIG. 2a, the XOR gate 136 is fed input signals 184, 186. Signal 184 is the system CLK signal that is generated by the CLK generator 26. The signal 186, however, is a variable signal that is adjusted high or low by some circuit logic, software, or other appropriate entity (not shown).

More specifically and as previously explained, in cases where data is being read from a DDR-1 memory device, unlike cases where data is read from M-DDRS, the DLLs of the DDR-1 devices keep timing parameters (e.g., strobe signal, system CLK and data) closely synchronized. Thus, the two-cycle-delay technique described above may be of greater use during read operations for M-DDRS, which have no DLLs to maintain timing parameter synchronization. As such, for DDR-1 read operations, the two-cycle-delay technique may cause an undesirable and unnecessary lag in processing time of one cycle per bit of data, since each bit is held for two clock cycles. To negate the effect of this extra cycle, the system CLK signal 184 is inverted using variable signal 186 and the XOR gate 136, such that the clock signals 190, 188 that are supplied to the flops 124, 126 are the inverted form of the clock signals 190, 188 that would be supplied to the flops 124, 126 during an M-DDR read operation. In this way, for a DDR-1 read operation, instead of releasing data each time the system CLK signal 184 is high, the flops 124, 126 may output data each time the system CLK signal 184 is low, thereby eliminating the extra cycle lag. After being synchronized to the system CLK domain, each data bit that is stored in either of the synchronization flops 124, 126 is released and provided to the rest of the ASIC 12 via lines 206, 208, respectively, for use by the ASIC 12 as needed.

FIGS. 2a, 2b and 2c are representative of read operations in the circuit 18 for successive, individual data bits. For example, $D_{0L}$ is a first data bit, followed by a second data bit $D_{0H}$, followed by a third data bit $D_{1L}$, and so forth. However, the data bus 20, as previously mentioned, may carry any suitable amount of data bits in parallel. For example, the data bus 20 may carry 8 bits at one time (i.e., 1 byte), 16 bits at a time, 64 bits at a time, or any other suitable number of bits. Because the circuit 18 processes individual bits in successive order instead of multiple, parallel bits at a time, 8 bits that arrive on the data bus 20 cannot all be processed by the circuit 18 alone. As such, the ASIC 12 may comprise multiple circuits 18, one for each data bit that arrives on data bus 20 in parallel with other data bits. Thus, for example, if the data bus 20 carries 8 bits at a time, then the ASIC 12 may, in some embodiments, comprise 8 circuits 18, one circuit 18 for each parallel data bit.

FIG. 3 shows a flowchart of an exemplary method used to perform a read operation using the circuit 18 of FIG. 2a. Referring to FIGS. 1a, 2a and 3, the method may begin by sending a READ command from the ASIC 12 to the memory device DDR-1 14 or M-DDR 16 (block 300). In turn, the memory device transfers at least one data bit to the circuit 18 of the ASIC 12. The circuit 18 receives the data bit as well as a strobe signal from the memory device (block 302). The method further comprises capturing the data bit into one of a plurality of flip-flops 108, 110, 112, 118 in the circuit 18 (block 304), whereupon the data bit is preferably held by the flop for two strobe cycles (block 306). If two strobe cycles have elapsed (block 308), then the data bit is output from the flop to one of the multiplexers 120, 122 (block 310). If two strobe cycles have not elapsed, then the method comprises continuing to hold the captured data bit in the flop (block 312) until two strobe cycles have passed.

Once the data bit has been output from the flop to a multiplexer 120, 122 (block 310), the method comprises holding the data bit at the multiplexer input (block 314). The method further comprises determining whether all data bits that arrived to the circuit 18 prior to the current data bit have been passed through one of the two multiplexers 120, 122 (block 316). If all data bits that arrived prior to the current data bit have not been passed through one of the multiplexers, then the method comprises continuing to hold the data bit at the multiplexer input (block 314). Otherwise, the data bit is allowed to pass through the multiplexer to one of the synchronization flops 124, 126 (block 318). The method comprises determining whether the data bit was read from a DDR-1 memory device (block 320). If the data bit was indeed read from a DDR-1 device, then the data bit has unnecessarily lost a clock cycle (i.e., in terms of speed), as explained above (i.e., since the bit was held for two clock cycles). As such, the method may supply the synchronization flop with an inverted clock signal (block 322) and output the data bit from the synchronization flop in sync with this clock signal (block 326), effectively synchronizing the data bit to the system CLK domain and regaining the lost clock cycle. The process then may be repeated for a new data bit (block 302). Otherwise, if the data bit was not read from an DDR-1 device at 320, then the method supplies the synchronization flop with the system CLK signal (block 324) and outputs the data bit from the synchronization flop in sync with this system CLK signal (block 326), thus synchronizing the data bit to the system CLK domain. The method then may be applied to a new data bit at 302.

In this way, by receiving, capturing and holding data bits in flip-flops for two clock cycles, the circuit 18 causes the timing of data bits, particularly those from M-DDRs, to become substantially predictable. Because the timing of the data bits becomes predictable, the circuit 18 is able to successfully synchronize the data bits to the system CLK domain, so the bits may be used by the rest of the ASIC 12 comprising the circuit 18. Furthermore, because the circuit 18 makes the timing of the M-DDR bits predictable, and because the circuit 18 successfully synchronizes the bits to the system CLK domain, the M-DDR and other DDR devices (e.g., DDR-1) may be coupled to the ASIC 12 using a single, cost-efficient data path 20.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a first double data rate (DDR) memory device;
a second DDR memory device coupled to the first DDR memory device, said second DDR memory device not using a delay locked loop (DLL) device to synchronize clock signals; and
a logic coupled to the first and second DDR memory devices, said logic adapted to receive data from the first and second DDR memory devices by way of a single conductive pathway.

2. The system of claim 1, wherein the second DDR memory device is a mobile-double data rate (M-DDR) memory device.

3. The system of claim 1, wherein the logic receives a strobe signal from at least one of the DDR memory devices.

4. The system of claim 3, wherein the strobe signal is not synchronous with a system clock associated with the logic.

5. The system of claim 3, wherein the logic stores the data in a second logic for multiple strobe cycles.

6. The system of claim 5, wherein the logic stores the data in the second logic for two strobe cycles.

7. The system of claim 5, wherein the second logic is a flip-flop.

8. The system of claim 1 wherein the system comprises at least one of a battery-operated communication device and a wireless communication device.

9. The system of claim 1, wherein the first DDR memory device does not use a DLL to synchronize clock signals.

10. An apparatus, comprising:
a plurality of flip-flops capable of substantially alternately storing data received from multiple double data rate (DDR) memory devices, at least one of said DDR memory devices not using a delay locked loop (DLL) device to synchronize clock signals;
wherein the apparatus receives data from the DDR memory devices via a single conductive pathway.

11. The apparatus of claim 10, wherein at least one of the DDR memory devices is a mobile-double data rate (M-DDR) memory device.

12. The apparatus of claim 10, wherein the apparatus receives a strobe signal from at least one of the DDR memory devices.

13. The apparatus of claim 11, wherein at least one of the flip-flops stores the received data for two strobe cycles.

14. The apparatus of claim 10 further comprising a synchronization flop that synchronizes the data to a clock associated with the apparatus.

15. The apparatus of claim 10, wherein the apparatus is a first-in, first-out system.

16. The apparatus of claim 10, wherein the apparatus comprises a wireless communication device.

17. A method, comprising:
via a single conductive pathway, receiving data and a strobe signal from multiple double data rate (DDR) memory devices, at least one of said devices not using a delay locked loop (DLL) device; and
storing the data in a logic for multiple strobe cycles.

18. The method of claim 17, wherein storing the data in-the logic comprises storing the data in a flip-flop.

19. The method of claim 17, wherein storing the data in the logic for multiple strobe cycles comprises storing the data in the logic for two strobe cycles.

20. The method of claim 17, wherein receiving data and the strobe signal from multiple DDR memory devices comprises receiving data and the strobe signal from at least one mobile-double data rate (M-DDR) memory device.

21. The method of claim 17 further comprising using a wireless communication device containing said multiple DDR memory devices.

* * * * *